United States Patent
McGuire et al.

[11] Patent Number: 5,847,558
[45] Date of Patent: Dec. 8, 1998

[54] PERIODIC SIGNAL ANALYZER USING A RANDOMLY VARIED PHASE SHIFTING CIRCUIT

[75] Inventors: Daniel McGuire, Salt Lake City; David Bytheway, Murray, both of Utah

[73] Assignee: Philips Electronics North America Corporation, New York, N.Y.

[21] Appl. No.: 700,702

[22] Filed: Jul. 10, 1996

[51] Int. Cl.⁶ .................................................. G01R 25/04
[52] U.S. Cl. .................................. 324/76.13; 324/76.12; 324/76.38; 327/2
[58] Field of Search ........................... 324/76.12, 76.13, 324/76.15, 76.38, 76.39, 76.52; 327/2, 50

[56] References Cited

U.S. PATENT DOCUMENTS

| | | | |
|---|---|---|---|
| 4,023,098 | 5/1977 | Roth | 324/76.12 |
| 4,893,266 | 1/1990 | Deem | 364/726.03 |

*Primary Examiner*—Glenn W. Brown
*Attorney, Agent, or Firm*—Michael Beck; Gregory L. Thorne

[57] ABSTRACT

A signal sampling circuit receives a clock signal indicative of a sampling rate and a periodic input signal to produce a digitized sampled output signal. The sampled signal is applied to an all-pass filter having a single pole/zero pair in which the pole/zero values are determined by a number supplied by a number generator. The number generator varies the applied number in a random or pseudorandom fashion to create a correspondingly random or pseudorandom variation of the transfer function of the filter. The filtered sample signal is then further processed by an absolute value operator and an average value operator for application to an amplitude responsive device such as a meter. The random or pseudorandom variation of the filter transfer function introduces a corresponding random or pseudorandom variation of the phase shift imposed upon the sampled signal within the filter. This. phase shift operates to impede or preclude the generation of erroneous beat note amplitude variations within the sampled signal for input signals having frequencies at or near the sampling rate or submultiples thereof.

30 Claims, 2 Drawing Sheets

PERIODIC SIGNAL ANALYZER USING A RANDOMLY VARIED PHASE SHIFTING CIRCUIT

BACKGROUND OF THE INVENTION

1. Field of the Invention

The present invention relates generally to digital signal systems and methods and particularly to systems and methods in which an input signal is sampled to form a digital signal which is then processed to produce a signal indicative of the amplitude of the input signal.

2. Description of Related Art

In digital signal systems, a need often arises to obtain a signal indicative of the amplitude of a periodic input signal such as a sine wave or the like. For example, many such systems measure and/or monitor the amplitude of a periodic signal such as a carrier. A similar need arises in digital signal systems in which a sampled periodic signal is applied to an amplitude responsive device. Examples of such systems are found in metering systems, broadcast systems in which a carrier amplitude is monitored, and test systems processing calibration signals or other test signals applied to signal processing channels such as audio systems.

In many systems of the above-described type, a signal such as a sine wave is first sampled to form a digital signal which in then measured or monitored for characteristics such as signal amplitude. Typical of such measuring or monitoring systems is the application of an absolute value conversion to the digital signal followed by an averaging operation which provides a digital signal suitable for application to an amplitude responsive device such as a meter, a gain control circuit or another device which utilizes an amplitude indicative signal.

FIG. 1 shows a typical amplitude measuring system of the type used in monitoring the carrier amplitude in an audio processing channel. Such systems are well known in the art and generally include a sampling circuit 11 to which an input signal such as a sinusoidal carrier signal is applied. Sampling circuit 11 converts the analog input carrier signal to a digitized signal which is then applied to an absolute value circuit 12. The latter performs a mathematical operation upon the digitized signal corresponding to absolute value calculation. The resulting absolute value output signal is then averaged in an average value filter 13 to provide a suitable digital signal for application to an amplitude sensitive device 14. In the example of an audio level monitoring system, amplitude sensitive device 14 most likely comprises a conventional VU or PPM type meter. Such systems are calibrated by applying a known input signal such as a constant frequency constant amplitude sinusoidal test signal to sampling circuit 11 and observing the reading of amplitude sensitive device 14. Once the carrier amplitude measurement at device 14 is verified as correct, system 10 may, for example, be used in monitoring audio levels within a broadcast system or other similar use. It will be understood, however, that the audio monitoring example in FIG. 1 may be generalized to include a variety of prior art systems in which the combination of a sampling circuit, an absolute value circuit, and an average value filter are utilized to provide a digital signal input to an amplitude responsive device.

While systems of the type generalized in FIG. 1 have proven, for the most part, to be satisfactory in performance and capability, a fundamental problem arises in such systems when the frequency of the input signal applied to the sampling circuit is near a submultiple (integer division) of the system sampling rate. When such a frequency relationship exists, the resulting digital signal applied to the amplitude sensitive device (device 14 in FIG. 1) includes an oscillatory amplitude variation or beat note. The effect of this amplitude variation upon the system causes a corresponding variation in the measured levels of the meter or other amplitude responsive device. If, for example, the system in FIG. 1 operates at a sampling rate of 48,000 samples per second and an input signal is applied having a frequency of 12,000.1 hertz, a VU or PPM meter used as device 14 in FIG. 1 would exhibit an apparent oscillation of 3 dB. The period of this oscillation would be approximately 2.5 seconds. A similar phenomenon may be observed for input signals having frequencies near other submultiples of the sampling frequency such as 6000.1 hertz, 8000.1 hertz, or 16,000.1 hertz. In such case, correspondingly different oscillation periods would result.

As mentioned, this problem is not confined to audio systems, but rather, is likely to occur in virtually any system utilizing an average value measurement of a sampled input signal in which a submultiple frequency relationship between the sample rate and signal frequency is present. Faced with such difficulties, practitioners in the art have generally attempted to avoid problems caused by these amplitude variation or beat note by utilizing a so-called "upsampling" method. This method simply involves the use of sampling rates which are much higher in frequency than the highest input signal frequency. While this approach to the problem usually proves adequate, it also substantially increases the computational loads upon the system processors. Therefore, upsampling solutions may, in many environments, be impractical due to higher cost and, in some cases, slow system speed because of the greatly increased number of samples computed.

There arises, therefore, a continuing need in the art for systems which provide signals indicative of the amplitude of signals which are sampled while avoiding the amplitude variation or beat note problems described above without costly upsampling. This need may arise virtually in any digital system which uses a digital signal formed by sampling a signal which is thereafter applied to an amplitude sensitive device following processing such as absolute value and/or average value operations.

SUMMARY OF THE INVENTION

Accordingly, it is a general object of the present invention to provide an improved system and method for processing a periodic signal for use in amplitude measurement or for use by amplitude responsive systems. It is a more particular object of the present invention to provide a system and method for preventing erroneous amplitude variation of sampled signals produced from a periodic signal and processed for use in such amplitude measurement, or for use by such amplitude responsive systems. It is a still more particular object of the present invention to provide a system and method for preventing erroneous amplitude variation of sampled signals produced from a periodic signal, wherein the sampled signals are operated upon by an absolute value circuit and/or an average value circuit prior to amplitude dependent use. It is even a still more particular object of the present invention to provide a system and method for preventing erroneous amplitude variation of sampled signals in environments in which the signal being sampled exhibits a frequency at or near a submultiple of the sampling system rate without resorting to costly and complex solutions such as upsampling.

The present invention system recognizes that the amplitude variation problem in such measuring or other amplitude responsive systems is most evident when the signal being sampled has a frequency which is near a submultiple of the system sampling rate. The present invention further recognizes that the amplitude variation is, in essence, a beat note phenomenon in which the signal being sampled and the periodic sampling operation create beat note signal products. The present invention also recognizes that the introduction of a randomized or pseudorandomized phase variation of the signal being sampled after the sampling process upsets the phase relationship between the beating signals which in turn prevents this erroneous amplitude variation. Still further, the present invention recognizes that this random or pseudorandom phase variation must be introduced in a manner which does not in itself cause erroneous amplitude variation of the sampled signal which is processed and applied to the amplitude sensitive device.

In accordance with the present invention, the sampled signal is passed through a constant amplitude all-pass filter having a random or pseudorandom moving pole/zero pair subsequent to the sampling operation. The all-pass filter utilizes computed pole and zero values which are functions of an applied number. This number is varied in a random or pseudorandom manner to provide correspondingly varied poles and/or zeros for the filter. Various sources of random or pseudorandom numbers for use by the filter are possible including conventional number generators. As the randomized or pseudorandomized phase shift is imparted to the sampled signal, the phase relationship between the signal being sampled and the sampling system operation is correspondingly randomized or pseudorandomized thereby avoiding the beat note phenomenon.

Thus, in accordance with the present invention, there is provided a system and method for processing a periodic signal. That system comprises (a) sampling means for periodically sampling the periodic signal to produce a sampled signal; and (b) phase means coupled to the sampling means for causing a varying phase shift of the sampled signal so that the sampled signal is substantially free of amplitude variation. That method comprises (a) periodically sampling the periodic signal to produce a sampled signal; and (b) causing a varying phase shift of the sampled signal to produce a variably phase-shifted sampled signal which is substantially free of amplitude variation.

The present invention also provides a system and method for producing a signal indicative of the amplitude of a periodic signal for use by an amplitude responsive device. That system comprises: (a) sampling means for periodically sampling the periodic signal at a sampling rate to form a digitally encoded signal; (b) an all-pass filter, coupled to the sampling means, having a phase shift characteristic which varies as a function of an input number to produce a phase-varying sampled signal from the digitally encoded signal; (c) a number generator, coupled to the all-pass filter, providing a succession of different input numbers thereto; (d) absolute value means, coupled to the all-pass filter, for forming an absolute value signal from the phase-varying sampled signal; and (e) averaging means, coupled to the absolute value means, for averaging the absolute value signal. That method comprises: (a) periodically sampling the periodic signal at a sampling rate to form a digitally encoded signal; (b) all-pass filtering the digitally encoded signal to impart a phase shift characteristic thereto which varies as a function of an input number to produce a phase-varying sampled signal from the digitally encoded signal; (c) providing a succession of different input numbers for use during the all-pass filtering; (d) forming an absolute value signal from the phase-varying sampled signal; and (e) averaging the absolute value signal.

Still further, the present invention provides a system and method for measuring the amplitude of a periodic signal. That system comprises: (a) means for sampling the periodic signal at a sampling rate to provide a sampled signal; (b) means for applying a variable phase shift to the sampled signal to provide a variable phase-shifted sampled signal; (c) means for processing the variable phase-shifted sampled signal to provide an average signal; and (d) means for measuring the amplitude of the averaged signal. That method comprises: (a) sampling the periodic signal at a sampling rate to provide a sampled signal; (b) applying a variable phase shift to the sampled signal to provide a variable phase-shifted sampled signal; (c) processing the variable phase-shifted sampled signal to provide an averaged signal; and (d) amplitude measuring the averaged signal.

BRIEF DESCRIPTION OF THE DRAWINGS

The present invention, together with further objects and advantages thereof, may best be understood by reference to the following description taken in conjunction with the accompanying drawings, in which.

(Like reference numbers in the figures identify like elements)

DESCRIPTION OF THE PREFERRED EMBODIMENT

Figure 2:
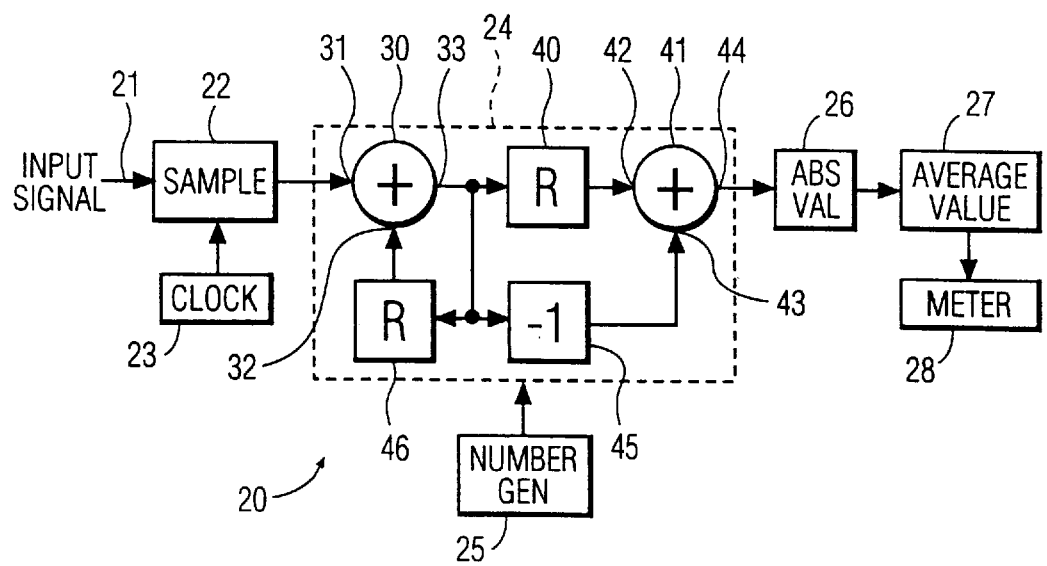
FIG. 2 sets forth a block diagram of a system, in accordance with the present invention, for preventing amplitude variation of sampled signals.

FIG. 2 sets forth a block diagram of a system, in accordance with the present invention, for preventing amplitude variation of sampled signals generally referenced by numeral 20. System 20 includes an input 21 coupled to a conventional sampling circuit 22. Sampling circuit 22 is coupled to a clock signal source 23 which controls the sample rate of sampling circuit 22. The output of sampling circuit 22 is coupled to an all-pass filter 24, shown in dashed outline, which in turn is coupled to a number generator 25. The output of all-pass filter 24 is coupled to an absolute value operator 26 which in turn is coupled to an average value operator 27. Finally, a meter 28, such as the above-described VU or PPM meter, is coupled to the output of the average value operator 27.

All-pass filter 24 includes an adder 30 having an input 31 for receiving the sampled signal from sampling circuit 22, an input 32 and an output 33. A multiplier 40 has an input coupled to output 33 of adder 30. A second adder 41 includes an input 42 coupled to the output of multiplier 40, an input 43 and an output 44. The latter is coupled to absolute value operator 26. Filter 24 further includes a multiplier 46 having an input coupled to output 33 of adder 30 and an output coupled to input 32 of adder 30. Filter 24 still further includes a multiplier 45 having an input coupled to output 33 of adder 30 and an output coupled to input 43 of adder 41.

Figure 1:
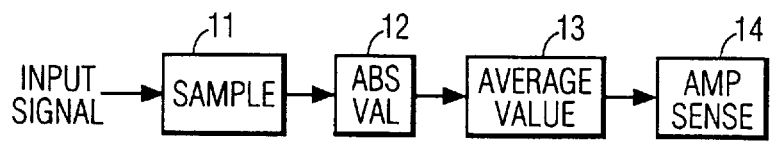
FIG. 1 sets forth a block diagram of a prior art amplitude measurement system.

By way of overview, a comparison of FIG. 2 with the prior art diagram of FIG. 1 reveals that the system shown in FIG. 2 differs from the prior art in that an all-pass filter 24 is interposed between the input signal sampling circuit and the absolute value operator. The present invention system can be seen to further differ from the prior art system of FIG. 1 in the inclusion of a number generator 25 which configures all-pass filter 24 in the manner described below.

In operation, an input signal at input 21 is sampled by sampling circuit 22 in accordance with the sampling rate provided by clock 23. The sampled signal output of sampling circuit 22 comprises a digital signal representative of the applied input signal. Thus, in essence the output of sampling circuit 22 forms a digital series of numbers resulting from periodic sampling at the frequency of clock 23. In its preferred form, filter 24 is a digital all-pass filter which defines a filter characteristic in which applied signals are passed from input to output without affecting or changing the signal amplitude and in which a phase shift is applied to the signals passed through the filter. Thus, in its preferred form, the sampled output signal of sampling circuit 22 is phase shifted by filter 24 but otherwise unaffected as it is coupled through filter 24 to absolute value operator 26.

The particular characteristics of filter 24 are described below in greater detail. However, suffice it to note here that the degree of phase shift imposed upon signals passing through filter 24 is subjected to a random or pseudorandom variation using the cooperation of number generator 25 and filter 24. The application of this random or pseudorandom variation of the filter characteristic, and therefore its phase shift, of filter 24 occurs prior to application of the sampled signal to absolute value operator 26. This in turn provides the operative mechanism by which the system, in accordance with the present invention, is able to dynamically alter the phase relationship between input signal and sample rate, and prevent erroneous amplitude variation of the sampled signal which is otherwise present in the above-described prior art system. Absolute value operator 26 calculates the absolute value of the applied sampled signal and couples it to average value operator 27. The average value of the absolute value signal is then applied to meter 28 for amplitude measurement.

It will be recognized by those skilled in the art that a variety of systems exist in which the need arises to sample a periodic signal with the ultimate objective of either determining the amplitude of the periodic signal or using the amplitude determination in subsequent signal processing. Thus, for example, a sampled signal may be measured, that is, applied to a meter or the like. Also, a sampled signal may be monitored by using amplitude information to maintain a predetermined signal amplitude. Still further, the amplitude derived from a sampled signal may be used to drive other system operations such as gain control, threshold trigger systems, comparators or the like. All such systems may benefit from use of the present invention in its ability to produce a signal indicative of the amplitude of a periodic signal which is sampled and free of amplitude error and which may be used to drive amplitude-responsive systems or devices.

Accordingly, it will be recognized by those skilled in the art that meter 28 shown in FIG. 2 is merely illustrative of a wide variety of amplitude responsive devices which may benefit from the present invention and which may be used in place of meter 28. Thus, for example, meter 28 may be replaced by an amplitude detector which forms a portion of a further system responsive to the amplitude variation of input signal at sampling circuit 22. It should be further understood by those skilled in the art that the present invention system is shown functionally in FIG. 2 and may be fabricated in a hardware or firmware configuration. However, it will be equally well recognized by those skilled in the art that the present invention system is optimally provided in a software environment in which the various functional elements shown in FIG. 2 represent computational operators within a software system.

In its preferred form, filter 24 comprises a digital all-pass filter which, as mentioned above, exhibits the essential characteristic of providing a phase shift without amplitude variation of signals coupled through the filter. It will be recognized by those skilled in the art that the essential function of filter 24 may be provided by a variety of different all-pass filters without departing from the spirit and scope of the present invention. In the embodiment shown in FIG. 2, filter 24 provides a single pole/zero pair lying on the real axis in the z plane. Filter 24 exhibits a pole at a number R and a zero at number 1/R. The combination and configuration of adders 30 and 41 together with multipliers 40, 45 and 46 shown within filter 24 represent a digital filter configuration in a mathematical model which provides the following transfer function:

$$H(z) = (R - 1/z)/(1 - R/z)$$

As mentioned, the above transfer function for filter 24 exhibits a pole at R and a zero at 1/R, with R being varied between zero and one. In further accordance with the present invention, the number values for R are supplied by number generator 25 and used in performing the all-pass filtering of filter 24. In accordance with an important aspect of the present invention, number generator 25 varies the value of R between zero and one in a random or pseudorandom variation producing corresponding variations of the pole at R and zero at 1/R of filter 24. Thus, as the values for R within filter 24 are varied by number generator 25, a corresponding variation in the phase shift applied by filter 24 to the sampled signal is produced. The time constant of this variation is determined by the operating characteristics of the amplitude responsive device. For example, in the event meter 28 is a VU or PPM meter, the time constant of filter variation is dependent upon the desired update rate of the meter and will be optimized for a particular meter. Accordingly, in the event meter 28 is replaced by a different amplitude responsive device, a correspondingly optimized time constant for R value variation is utilized.

In accordance with an important aspect of the present invention, the combination of filter 24 and number generator 25 cooperate to impose a pseudorandom or random variation of phase shift for signals coupled from sampling circuit 22 to absolute value operator 26 with varying signal amplitude. This random or pseudorandom variation provides a computationally efficient method for avoiding the above-described erroneous amplitude variation problems encountered in prior art systems when input signal frequencies are close to submultiples of the clock signal frequency used in sampling the input signal. The improved computational efficiency of the present invention system far surpasses the efficiency of the more burdensome prior art approach of upsampling referred to above. As a result, the present invention system may be provided without unduly increasing system complexity or cost. In essence, the variable phase shift imposed upon sampled signals in the present invention system approximates a "phase jitter" of the sampled signal which destroys the harmful phase relationships which would otherwise arise between the sample signal and the sampling system operation, and would lead to the undesired beat note characteristic.

Number generator 25 may be fabricated in accordance with conventional fabrication techniques and may assume any number of a variety of conventional pseudorandom or random number generators well known in the art. For example, number generator 25 may utilize a routine in which a register sequentially loaded with a series of bits such that each new input bit is the exclusive OR product of the register output bit and next succeeding output bit. This type of number generator is well known in the art and provides a pseudorandom number generation. Thus, in the event the system of FIG. 2 is a part of an audio system in which meter 28 comprises a conventional VU or PPM meter and in which a sampling rate of 48,000 samples per second is used by sampling unit 22, a pseudorandom number generator of the exclusive-OR type described above using a twenty four position register provides sufficient pseudorandom number variation to meet virtually all submultiple frequencies of the input signal. It will be recognized that in the event a different sampling rate is used or in the event a different characteristic amplitude sensitive device is used, that number generator 25 may be varied to provide sufficient randomized or pseudo-randomized phase shifting of filter 24.

Figure 3:
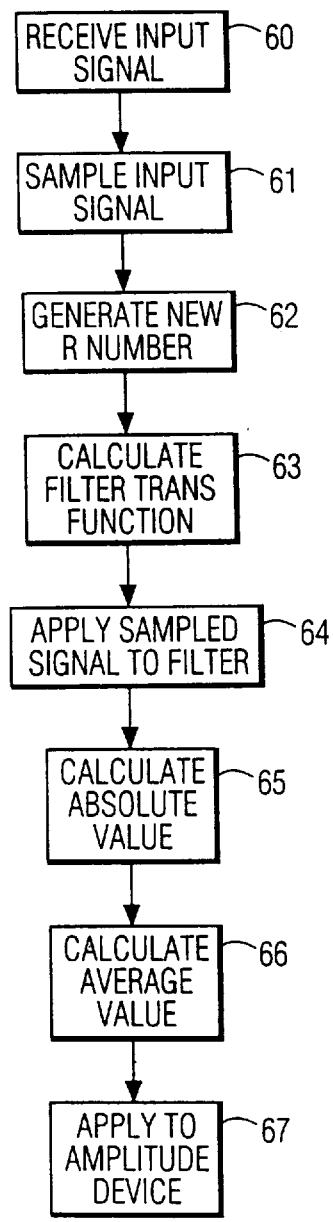
FIG. 3 sets forth a flow diagram of a method, in accordance with the present invention, of operation for preventing amplitude variation of sampled signals using phase variation.

FIG. 3 sets forth a flow diagram of the method of operation of a system, in accordance with the present invention, for preventing amplitude variation of sampled signals using phase variation. Initially, at step 60, an input signal is received. The input signal may, for example, be a sinusoidal test signal having a frequency at or near the sampling rate used within the system or at or near a submultiple thereof. At step 61, the input signal is sampled at the system sampling rate. At step 62, a number R is generated by the system number generator and at step 63 a filter transfer function is calculated based upon the R number provided by the number generator. Thereafter, at step 64, the sampled signal is subjected to the calculated filter transfer function. At step 65, the absolute value of the filtered sampled signal is calculated, afterwhich at step 66, the average value of the resulting calculation at absolute value step 65 is calculated. The filtered absolute value average value modified signal is then applied at step 67 to an amplitude responsive device. This method of operation is repetitively performed as the input signal is applied to the sampling circuit and each new value of R for the filter transfer function is provided by the number generator.

What has been shown is a novel and computationally efficient method and apparatus for providing a signal indicative of the amplitude of a periodic signal, which method and apparatus prevent amplitude variation caused by sampling the period signal by utilizing a random or pseudorandomly varied phase shift all-pass filter. The system provided may be implemented in either a hardware, firmware, or software implementation. The random or pseudorandom variation of phase shift within the all-pass filter avoids beat note produced errors in measured amplitude of periodic signals having frequencies near a submultiple of the sampling frequency. In applying the present invention system to different operating environments, a variety of all-pass filter configurations and filter characteristics may be utilized to provide the randomized or pseudorandomized phase variation. However, it has been found that a relatively simple all-pass filter having a single pole/zero pair lying on the real axis in the z plane provides excellent benefit in operational environments such as metering systems for monitoring audio levels or the like.

While particular embodiments of the present invention have been shown and described, it will be obvious to those skilled in the art that changes and modifications may be made without departing from the present invention in its broader aspects.

That which is claimed is:

1. A system for processing a periodic signal, comprising:

sampling means for periodically sampling said periodic signal to produce a sampled signal; and phase means coupled to said sampling means for causing a varying phase shift of said sampled signal so that said sampled signal is substantially free of amplitude variation.

2. The system as set forth in claim 1 wherein said phase means includes:

a filter having a phase shift characteristic which varies as a function of an input number; and a number generator for producing a variable input number.

3. The system as set forth in claim 2 wherein said filter is an all-pass filter having at least one pole/zero pair defined by said input number.

4. The system as set forth in claim 3 wherein said number generator is a random number generator.

5. The system as set forth in claim 3 wherein said number generator is a pseudorandom number generator.

6. The system as set forth in claim 1, wherein said sampling means periodically samples said periodic signal in accordance with a sampling rate, and said periodic signal has a frequency which is at or near said sampling rate or a submultiple thereof.

7. The system as set forth in claim 1, further comprising amplitude responsive means coupled to said phase means for responding to the amplitude of said sampled signal.

8. A method for processing a periodic signal, comprising:

periodically sampling said periodic signal to produce a sampled signal; and causing a varying phase shift of said sampled signal to produce a variably phase-shifted sampled signal which is substantially free of amplitude variation.

9. The method as set forth in claim 8, wherein said periodic signal is periodically sampled in accordance with a sampling rate, and its frequency is at or near said sampling rate or a submultiple thereof.

10. The method as set forth claim 8, further comprising utilizing said variably phase-shifted sampled signal in an amplitude responsive system.

11. A system for producing a signal indicative of the amplitude of a periodic signal for use by an amplitude responsive means, the system comprising:

sampling means for periodically sampling said periodic signal at a sampling rate to form a digitally encoded signal;

an all-pass filter, coupled to said sampling means, having a phase shift characteristic which varies as a function of an input number to produce a phase-varying sampled signal from said digitally encoded signal;

a number generator, coupled to said all-pass filter, providing a succession of different input numbers thereto;

absolute value means, coupled to said all-pass filter, for forming an absolute value signal from said phase-varying sampled signal; and averaging means, coupled to said absolute value means, for averaging said absolute value signal.

12. The system as set forth in claim 11, wherein said number generator is a random number generator providing a succession of random numbers.

13. The system as set forth in claim 11, wherein said number generator is a pseudorandom number generator providing a pseudorandom succession of numbers.

14. The system as set forth in claim 13, wherein said all-pass filter defines a substantially constant amplitude characteristic.

15. The system as set forth in claim 14, wherein said all-pass filter defines a transfer function having a single pole/zero pair each of which is a function of said input number.

16. The system as set forth in claim 15, wherein said amplitude responsive means includes a meter.

17. The system as set forth in claim 12, wherein said all-pass filter defines a substantially constant amplitude characteristic.

18. The system as set forth in claim 17, wherein said all-pass filter defines a transfer function having a single pole/zero pair each of which is a function of said input number.

19. The system as set forth in claim 18, wherein said amplitude responsive means includes a meter.

20. An amplitude responsive system, comprising:

the system as set forth in claim 11; and said amplitude responsive means, wherein said amplitude responsive means is coupled to said averaging means.

21. The system as set forth in claim 20, wherein said amplitude responsive means includes a meter.

22. A method for producing a signal indicative of the amplitude of a periodic signal for use by an amplitude responsive device, the method comprising:

periodically sampling said periodic signal at a sampling rate to form a digitally encoded signal;

all-pass filtering said digitally encoded signal to impart a phase shift characteristic thereto which varies as a function of an input number to produce a phase-varying sampled signal from said digitally encoded signal;

providing a succession of different input numbers for use during said all-pass filtering;

forming an absolute value signal from said phase-varying sampled signal; and averaging said absolute value signal.

23. A system for measuring the amplitude of a periodic signal, comprising:

means for sampling said periodic signal at a sampling rate to provide a sampled signal;

means for applying a variable phase shift to said sampled signal to provide a variable phase-shifted sampled signal;

means for processing said variable phase-shifted sampled signal to provide an average signal; and means for measuring the amplitude of said averaged signal.

24. The system as set forth in claim 23, wherein said means for applying a variable phase shift includes:

an all-pass filter having a phase shift characteristic which varies as a function of an input number to produce the phase-varying sampled signal from said sampled signal; and a number generator, coupled to said all-pass filter, providing a succession of different input numbers thereto.

25. The system as set forth in claim 24, wherein said all-pass filter defines a transfer function having a single pole/zero pair each of which is a function of said input number.

26. The system as set forth in claim 24, wherein said number generator is a random number generator providing a succession of random numbers.

27. The system as set forth in claim 24, wherein said number generator is a pseudorandom number generator providing a pseudorandom succession of numbers.

28. A method of measuring the amplitude of a periodic signal, comprising:

sampling said periodic signal at a sampling rate to provide a sampled signal;

applying a variable phase shift to said sampled signal to provide a variable phase-shifted sampled signal;

processing said variable phase-shifted sampled signal to provide an averaged signal; and amplitude measuring said averaged signal.

29. The method of claim 28 wherein said applying step includes the steps of:

filtering said sampled signal using a filter transfer function having at least one pole/zero pair which are functions of an input number; and providing a randomly varying input number for use in said filtering step.

30. The method of claim 28 wherein said applying step includes the steps of:

filtering said sampled signal using a filter transfer function having at least one pole/zero pair which are functions of an input number; and providing a pseudo-randomly varying input number for use in said filtering step.

* * * * *